United States Patent [19]

Stark et al.

[11] Patent Number: 4,780,169

[45] Date of Patent: Oct. 25, 1988

[54] NON-UNIFORM GAS INLET FOR DRY ETCHING APPARATUS

[75] Inventors: Mark M. Stark, Kamakura, Japan; Douglas H. Warenback, San Rafael; David J. Drage, Sebastopol, both of Calif.

[73] Assignee: Tegal Corporation, Petaluma, Calif.

[21] Appl. No.: 48,344

[22] Filed: May 11, 1987

[51] Int. Cl.⁴ ............................................... C23F 1/02
[52] U.S. Cl. ..................................... 156/345; 204/298
[58] Field of Search ...................... 156/643, 345, 646; 204/298

[56] References Cited

U.S. PATENT DOCUMENTS

| | | | |
|---|---|---|---|
| 4,534,816 | 8/1985 | Chen et al. | 156/345 |
| 4,585,920 | 4/1986 | Hoog et al. | 156/345 X |
| 4,595,452 | 6/1986 | Landau et al. | 156/643 |
| 4,600,464 | 7/1986 | Desilets et al. | 156/345 |
| 4,614,639 | 9/1986 | Hegedus et al. | 156/345 X |

Primary Examiner—Kenneth M. Schor
Assistant Examiner—Thi Dang
Attorney, Agent, or Firm—Paul F. Wille

[57] ABSTRACT

A gas inlet having a non-uniform array of inlet holes for the non-uniform introduction of an etching gas into a reaction chamber of a dry etching apparatus. The non-uniform introduction of gas compensates for non-uniform characteristics in the dry etching apparatus resulting in a uniform etch.

7 Claims, 2 Drawing Sheets

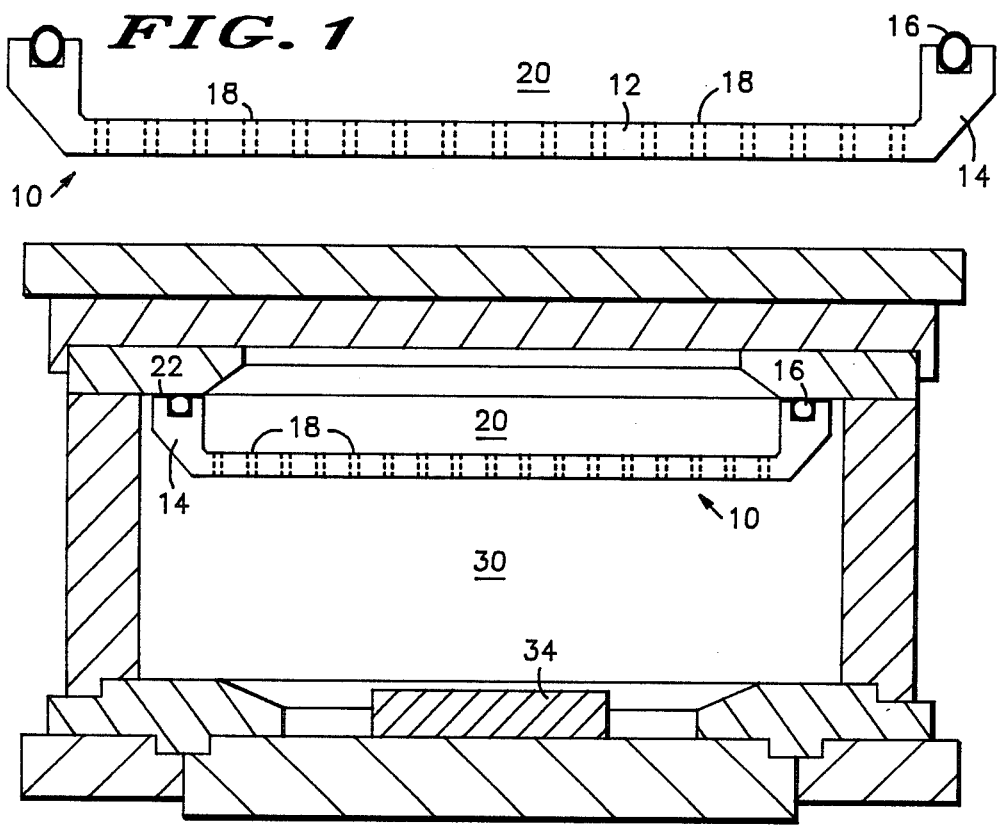
FIG. 1
FIG. 2
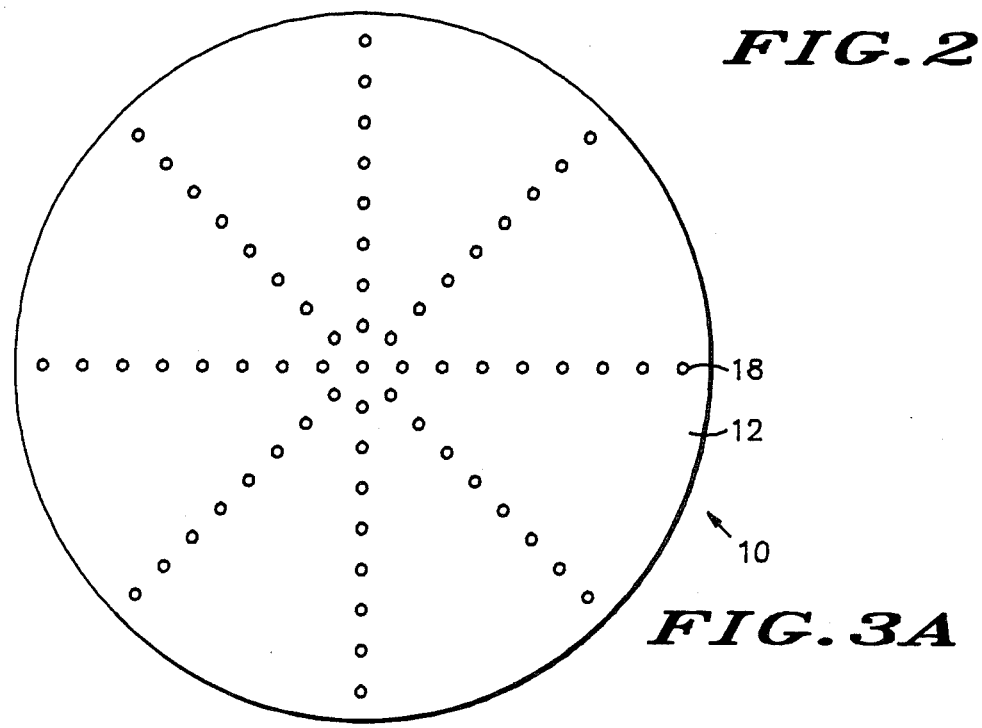
FIG. 3A

NON-UNIFORM GAS INLET FOR DRY ETCHING APPARATUS

BACKGROUND OF THE INVENTION

The present invention pertains to a device and method for introducing an etching gas into the reaction chamber of a dry etching apparatus.

In dry etching apparatus, the etching gas is ionized by electrons flowing between two or more electrodes to form a plasma. It is this plasma which then etches a workpiece. It is desirable for this etching to be done in a uniform manner over the entire workpiece.

In the prior art, one of the techniques used in attempting to obtain a uniform etch is to introduce the etching gas in a uniform manner. This is accomplished by the use of a plurality of small uniform inlet holes which introduce a constant flow of etching gas into a reaction chamber as shown in U.S. Pat. No. 4,534,816 entitled "Single Wafer Plasma Etch Reactor", issued Aug. 13, 1985. This, along with other prior art, utilize a plurality of small uniform inlet holes to introduce an etching gas uniformly. Other devices such as trumpet-shaped or split gas inlets introduce the gas uniformly through larger openings. The prior art strives to introduce the gas over a uniform area so that a uniform plasma glow will be established, which is then capable of etching the workpiece in a uniform manner.

The problem with this prior art is that the gas might be introduced uniformly, but other characteristics of the dry etching apparatus are non-uniform. Thus, the resulting etch, as in the trumpet-shaped gas inlet, which commonly results in a doughnut clearing pattern, is non-uniform.

SUMMARY OF THE INVENTION

The present invention is a device and method for providing a non-uniform introduction of an etching gas into a reaction chamber of a dry etching apparatus. The non-uniform introduction of the gas is so designed as to compensate for the many other non-uniform characteristics of a dry etching apparatus, resulting in a uniform etch. The introduction of the etching gas is accomplished by placing an inlet plate in the reaction chamber of a dry etching apparatus. This plate is located opposite the workpiece and closes off a volume which is then filled with the etching gas at a constant pressure. This gas then enters the reaction chamber through a plurality of small non-uniform inlet holes in the plate.

It is an object of this invention to provide new and improved apparatus and method for introducing an etching gas into a dry etching apparatus.

It is a further object of this invention to provide a method and device for a more uniform etch.

These and other objects of the present invention will become apparent to those skilled in the art upon consideration of the accompanying specification, claims and drawings.

BRIEF DESCRIPTION OF THE DRAWINGS

FIG. 1 is a sectional view in side elevation of a gas inlet plate constructed according to the present invention;

FIG. 2 is a cross-sectional view in side elevation of the gas inlet plate of FIG. 1 installed in a plasma etcher; and FIGS. 3a, 3b and 3c are bottom views of three embodiments of the gas inlet plate of FIG. 1 illustrating gas inlet hole pattern according to the present invention.

DESCRIPTION OF THE PREFERRED EMBODIMENT

Figure 3B:
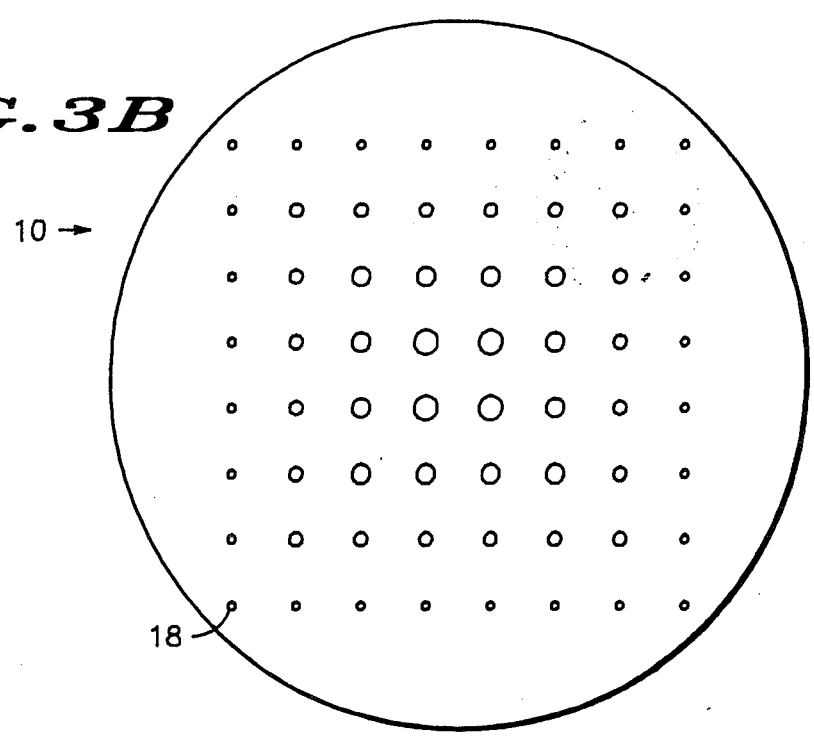

Referring now to the drawings, FIG. 1 is a cross section of a preferred embodiment of gas inlet plate 10. Gas inlet plate 10 has circular face 12 in which numerous small inlet holes 18 are formed. Around the periphery of face 12 is projecting ridge 14 in the surface of which is formed a circular groove having o-ring 16 positioned therein. Gas inlet plate 10 has a plurality of small inlet holes 18 formed through its surface and connecting with space 20 which is formed by projecting ridge 14.

FIG. 2 is a cross section of a plasma etch apparatus with an embodiment of gas inlet plate 10 in place. In this embodiment plate 10 is attached to upper surface 32 of reaction chamber 30 directly opposite and centered over workpiece 34. Gas volume 20 is formed, and separated from reaction chamber 30, by gas inlet plate 10 and surface 32 upon which it is attached. The joint between surface 32 and projecting ridge 14 is sealed by o-ring 16. It should be understood by those skilled in the art that there are many other ways of attaching inlet plate 10 to form a gas volume 20, other than with projecting ridge 14. There are now two spaces inside the plasma etcher, reaction chamber 30 and gas volume 20. Etching gas is introduced into gas volume 20 by means of an inlet (not shown) so that the gas in volume 20 is maintained at a constant gas pressure. This allows the etching gas to be introduced into reaction chamber 30 equally through each inlet hole 18.

As shown in FIG. 3a, inlet holes 18 of inlet plate 10, form a pattern and are non-uniformly distributed over face 12. A greater density of holes are located near the center of the plate with spokes, consisting of inlet holes 18, radiating outwardly. While in the present embodiment a radial array of inlet holes in a spoked pattern is described, the number, spacing or symmetry of the holes may vary according to the dry etching apparatus employed. Any of the changes in the basic design would be determined empirically according to the many, and varying parameters.

The radially spoked pattern of gas inlet holes has a greater density of inlet holes at the center of the inlet plate. In the preferred embodiment the placement of inlet holes provides a radially smooth gradient of gas flow, with the highest flow to the center of the workpiece, and increasingly lower flow rates towards the edge of the workpiece. This minimizes the current doughnut etch pattern of the trumpet-shaped design gas inlet, found to be significant on 5" and 6" wafers.

Figure 3C:
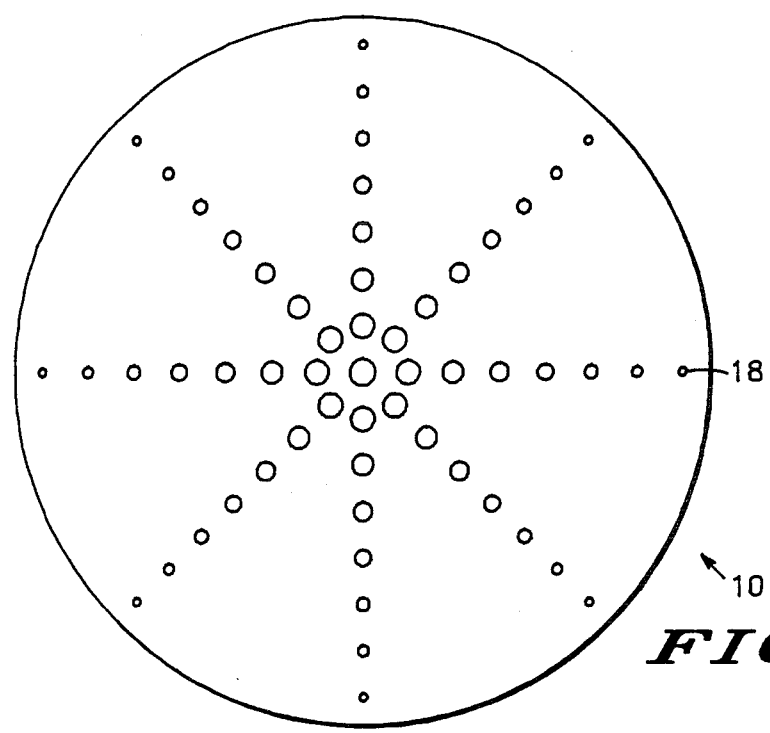

The term non-uniform array is used to define inlet holes 18 in a non-uniform pattern as in FIG. 3a, or as a pattern of different size inlet holes 18, as shown in FIGS. 3b and 3c. In FIGS. 3b and 3c the flow is still greater near the center of inlet plate 10, and is less towards the edge of plate 10. Thus, non-uniform array is used to mean a pattern of inlet holes either non-uniformly spaced or of non-uniform size, in a pattern which introduces an etching gas non-uniformly into the reaction chamber of a dry etching apparatus. This compensates for non-uniformity inherent in an etching apparatus, and results in a uniform etch.

Example: The apparatus and method described, was used in a dry etching apparatus. Uniformity was measured for a partial etch of one minute; after native oxide clearing. Uniformity data is based upon thirteen points per wafer. Using a gas flow rate of 75 to 225 sccm at a pressure of 0.150 torr aluminum was etched on a 5" wafer. The etching gas used was composed of $SiCl_4$ and $Cl_2$ in a four to one ratio respectively. 500 watts at 13.56 mhz was used to achieve an etch rate of from 6000 to 12000 A°/min at a uniformity of under 5%.

While in the preferred embodiment, plate 10 is constructed of Anodized aluminum, it should be obvious to those skilled in the art that many other materials could be used.

This non-uniform introduction of gas into the reaction chamber compensates for the many non-uniform characteristics of dry etching apparatus to result in a uniform etch. Thus, a method and apparatus has been enveloped whereby the non-uniform introduction of gas into a reaction chamber of a dry etching apparatus results in the uniform etching of a workpiece.

While we have shown and described a specific embodiment of this invention, further modifications and improvements will occur to those skilled in the art. We desire it to be understood, therefore, that this invention is not limited to the particular form shown and we intend in the appended claims to cover all modifications which do not depart from the spirit and scope of this invention.

We claim:

1. In a reaction chamber for containing a glow discharge including a means for creating a plasma glow discharge in the presence of a gas for etching, said chamber being structured for producing a non-uniform etch in a surface to be treated, the improvement comprising:

an inlet plate coupled to a surface of said reaction chamber for defining a gas chamber;

means for holding said surface to be etched within said reaction chamber, adjacent said inlet plate and outside said gas chamber;

wherein said inlet plate defines at least one array of holes through said inlet plate so that gas can flow from said gas chamber to said surface to be treated; and said holes being non-uniformly distributed over the surface of said inlet plate so that gas flows more readily through some areas of said plate than through others so as to provide a uniform etch.

2. The reaction chamber as set forth in claim 1, wherein said inlet plate comprising more than one array of holes wherein the holes in each array have a different diameter from the holes in the other arrays.

3. The reaction chamber as set forth in claim 2 wherein the larger diameter holes are located near the center of said inlet plate.

4. The reaction chamber as set forth in claim 3 wherein said arrays together form a spoked pattern.

5. The reaction chamber as set forth in claim 1 wherein said array forms a spoked pattern.

6. A gas inlet as claimed in claim 7 wherein said inlet plate comprises aluminum.

7. A gas inlet as claimed in claim 6 wherein said inlet plate is anodized.

* * * * *